US010955865B1

(12) United States Patent
N M et al.

(10) Patent No.: US 10,955,865 B1
(45) Date of Patent: Mar. 23, 2021

(54) FIRMWARE-CONTROLLED CABLE DROP VOLTAGE COMPENSATION

(71) Applicant: Cypress Semiconductor Corporation, San Jose, CA (US)

(72) Inventors: Jeevith Kumar N M, Bengaluru (IN); Kailas Iyer, Bangalore (IN); Debraj Bhattacharjee, Bengaluru (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/902,990

(22) Filed: Jun. 16, 2020

Related U.S. Application Data

(60) Provisional application No. 62/964,474, filed on Jan. 22, 2020.

(51) Int. Cl.
| | |
|---|---|
| G11C 5/14 | (2006.01) |
| G05F 1/46 | (2006.01) |
| H03M 1/12 | (2006.01) |
| H03F 1/38 | (2006.01) |

(52) U.S. Cl.
CPC ............... G05F 1/46 (2013.01); H03F 1/38 (2013.01); H03M 1/12 (2013.01)

(58) Field of Classification Search
CPC .. H02M 3/156; H02M 3/1588; H02M 3/1584; H02M 3/158; Y02B 70/1466; Y02B 60/1217; Y02B 60/1285; G06F 1/3203; G06F 1/26; G06F 1/3296; G11C 5/147; G05F 1/465; G05F 3/205; G05F 3/262; H04B 1/1623
USPC .................................................. 327/306, 530
See application file for complete search history.

(56) References Cited

U.S. PATENT DOCUMENTS

| | | | |
|---|---|---|---|
| 9,590,510 B1 | 3/2017 | Sheng et al. | |
| 9,906,143 B1 | 2/2018 | Yu et al. | |
| 10,033,285 B1 | 7/2018 | Zhang et al. | |
| 10,333,260 B2 | 6/2019 | Card | |
| 10,437,311 B2 | 10/2019 | Chuang et al. | |
| 10,594,216 B2 | 3/2020 | Li et al. | |
| 10,629,288 B2 | 4/2020 | Cariello | |
| 2014/0163716 A1 | 6/2014 | Chang et al. | |
| 2015/0323979 A1* | 11/2015 | Kaestner | G06F 1/266 |
| | | | 713/323 |

(Continued)

OTHER PUBLICATIONS

Mark Fu, et al., "Bringing Next-Generation USB Power Delivery to Vehicles", Embedded Computer Design, Dec. 9, 2019, 9 pages.

*Primary Examiner* — Quan Tra
(74) *Attorney, Agent, or Firm* — Lowenstein Sandler LLP

(57) ABSTRACT

An integrated circuit includes a processor coupled to a voltage bus of a cable and located within a universal serial bus (USB) compatible power supply device. A current sense amplifier (CSA) is coupled to a sense resistor to monitor a current of the voltage bus. A first comparator is coupled to the CSA and the processor and to trigger in response to detecting that a monitored current value from the CSA is greater than or equal to a first reference value, which includes a hysteresis offset value. An analog-to-digital converter (ADC) is coupled to the CSA and the processor. In response to detecting trigger of the first comparator, the processor is to trigger the ADC to measure an absolute current value of voltage bus, and cause an additional voltage, equal to a voltage drop across the cable based on the absolute current value, to be supplied to the voltage bus.

20 Claims, 8 Drawing Sheets

(56) References Cited

U.S. PATENT DOCUMENTS

| | | | |
|---|---|---|---|
| 2018/0074574 A1* | 3/2018 | Camiolo | G06F 1/3287 |
| 2018/0254530 A1 | 9/2018 | Wigney | |
| 2019/0074763 A1* | 3/2019 | Pons | H02M 3/156 |
| 2020/0001887 A1 | 1/2020 | Srivastava et al. | |
| 2020/0004286 A1 | 1/2020 | Mosalikanti et al. | |
| 2020/0050251 A1 | 2/2020 | Naik et al. | |
| 2020/0127562 A1 | 4/2020 | Pons | |

* cited by examiner

FIRMWARE-CONTROLLED CABLE DROP VOLTAGE COMPENSATION

RELATED APPLICATIONS

This application claims the benefit of priority to U.S. Provisional Patent Application No. 62/964,474, filed Jan. 22, 2020, which is herein incorporated by this references in its entirety.

TECHNICAL FIELD

The disclosure relates to the field of electronic circuits, and in particular, to firmware-controlled cable drop voltage compensation.

BACKGROUND

In an ideal power connection using a connection cable, a sink receives the same voltage and current as supplied by a power source. Though the power source supplies an expected voltage and current, the voltage received by the sink may be less because of the voltage drop across the connecting cable. The cable drop depends on the cable resistance and current flowing through the cable.

BRIEF DESCRIPTION OF THE DRAWINGS

The disclosure is illustrated by way of example, and not of limitation, in the figures of the accompanying drawings.

DETAILED DESCRIPTION

Figure 1:
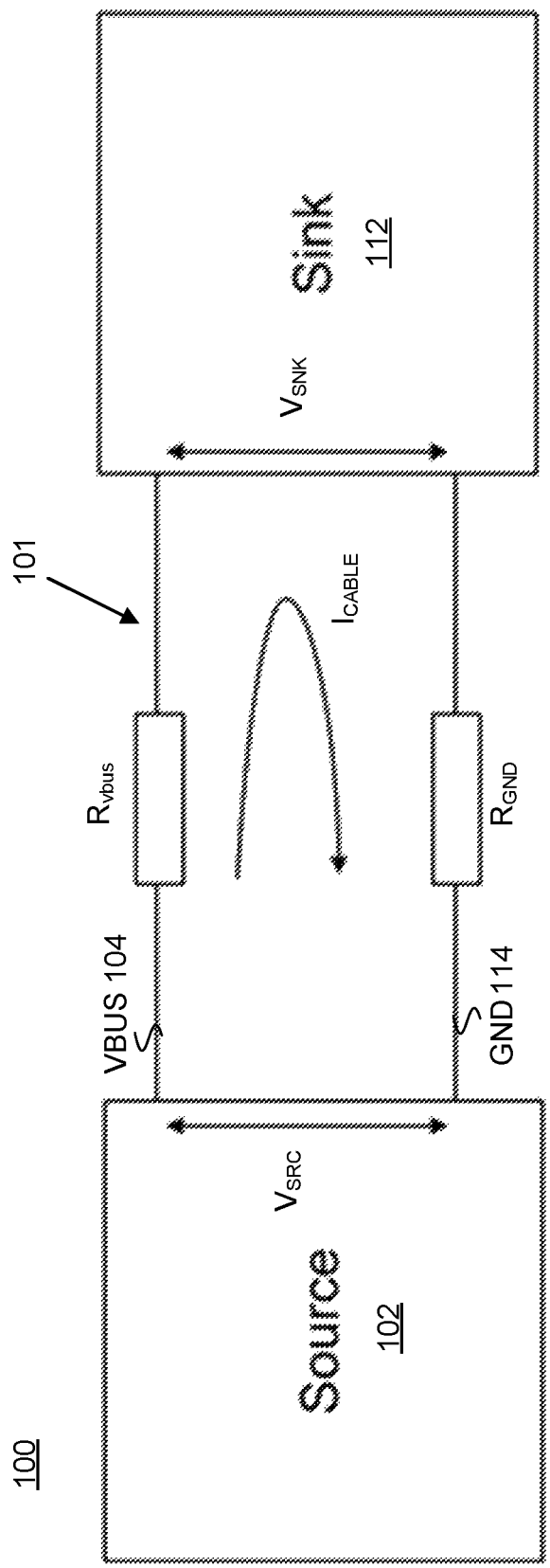
FIG. 1 is a block diagram of a power transfer system including a cable according to an embodiment.

FIG. 1 is a block diagram of a power transfer system 100 including a cable 101 according to an embodiment. The system 100 may include a source 102 and a sink 112 that are connected together by the cable 101, e.g., a connection cable. The source 102 may provide power and thus be a source of voltage ($V_{SRC}$) and current, through the cable 101, to the sink 112.

The sink 112 may be a load that is to draw the current at different rates depending on a type of device and level of processing (and other sources of consumption) at the sink 112. The sink 112 may be any number of electronic devices that may draw current and also send and receive data through the cable 101. For example, the sink 112 may be a portable computer, smart phone, a charging block, a printer, a scanner, a camera, a connection hub, a combination thereof, or other electronic device. The sink 112 that is connected to the cable 101 may also change, and thus drawn differing amounts of current based on such changes.

The source 102 may be a serial bus-compatible power supply device, such as a serial bus power delivery (SBPD) device with a power control analog subsystem having a programmable reference generator, multiplexers, and comparators that are used to provide multiple interrupt functions. The SBPD (also referred to as a "source device" herein) may be a universal serial bus (USB) compatible power supply device.

In various embodiments, the cable 101 includes a voltage bus (VBUS) 104 portion and a ground bus (GND) 114 portion. The source 102 supplies voltage ($V_{SRC}$) and also current drawn by the sink, referred to as cable current ($I_{CABLE}$). The resistance of the cable 101 may be a combination of a resistance of the VBUS 104, or $R_{VBUS}$, and a resistance of the GND 114, or $R_{GND}$. The voltage drop across the sink 112 may be referred to as the sink voltage ($V_{SNK}$). A voltage difference between the source voltage and the sink voltage is a voltage drop ($V_{DROP}$) expressed as cable current ($I_{CABLE}$) times the cable resistance ($R_{VBUS}$ plus $R_{GND}$). Accordingly, the sink voltage ($V_{SNK}$) may be expressed as the source voltage ($V_{SRC}$) minus the voltage drop ($V_{DROP}$). In some embodiments, the regulated power supply from the source 102 onto the voltage bus is five volts (V), which can vary but may be used herein as an one example of a nominal source voltage.

In corresponding embodiments, the sink voltage is to be supplied at the same level as the source voltage so that the electronic circuitry at the sink 112 also has a reliable power supply voltage, e.g., five volts in this example. But, because of the voltage drop experienced due to the resistance of the cable 101, the source voltage can be dynamically changed to compensate for the voltage drop. More specifically, the source 102 may supply, to the nominal voltage of the voltage bus, an additional voltage that is equal to the voltage drop. Thus, for example, if the voltage drop is 0.75 V, the source voltage is increased to 5.75 V. Further suppose that the cable current reduces such that the voltage drop is now 0.25 V, the source 102 may reduce the source voltage to 5.25 V so that the sink voltage remains at about 5 V. The source 102 may make dynamic adjustments to the source voltage ($V_{SRC}$) in this way to compensate for changing current demands from the sink 112.

Figure 2A:
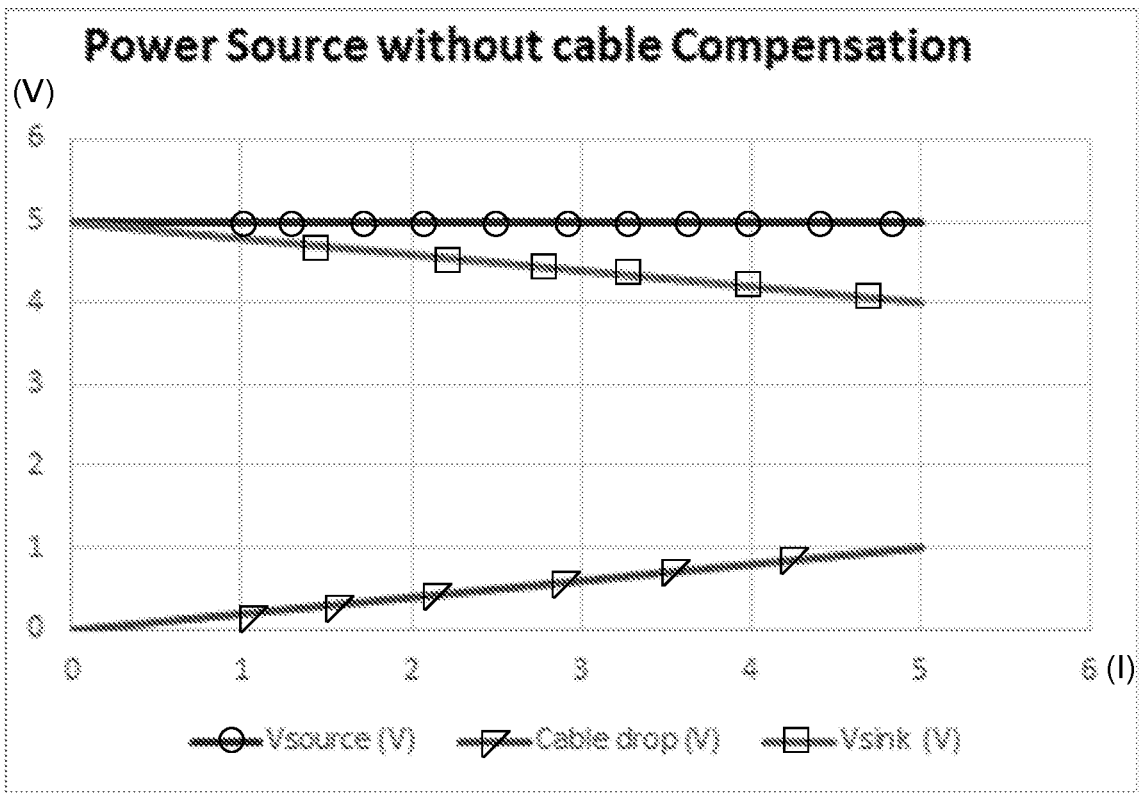
FIG. 2A is a graph illustrating power supplied between a source and sink without cable compensation according to an embodiment.

FIG. 2A is a graph illustrating power supplied between the source 102 and the sink 112 without cable compensation according to an embodiment. As noted, the sink voltage decreases in an amount equal to the voltage drop of the cable. As the voltage drop in the cable 101 increases, the sink voltage is reduced (e.g., drops) in a corresponding amount of voltage.

Figure 2B:
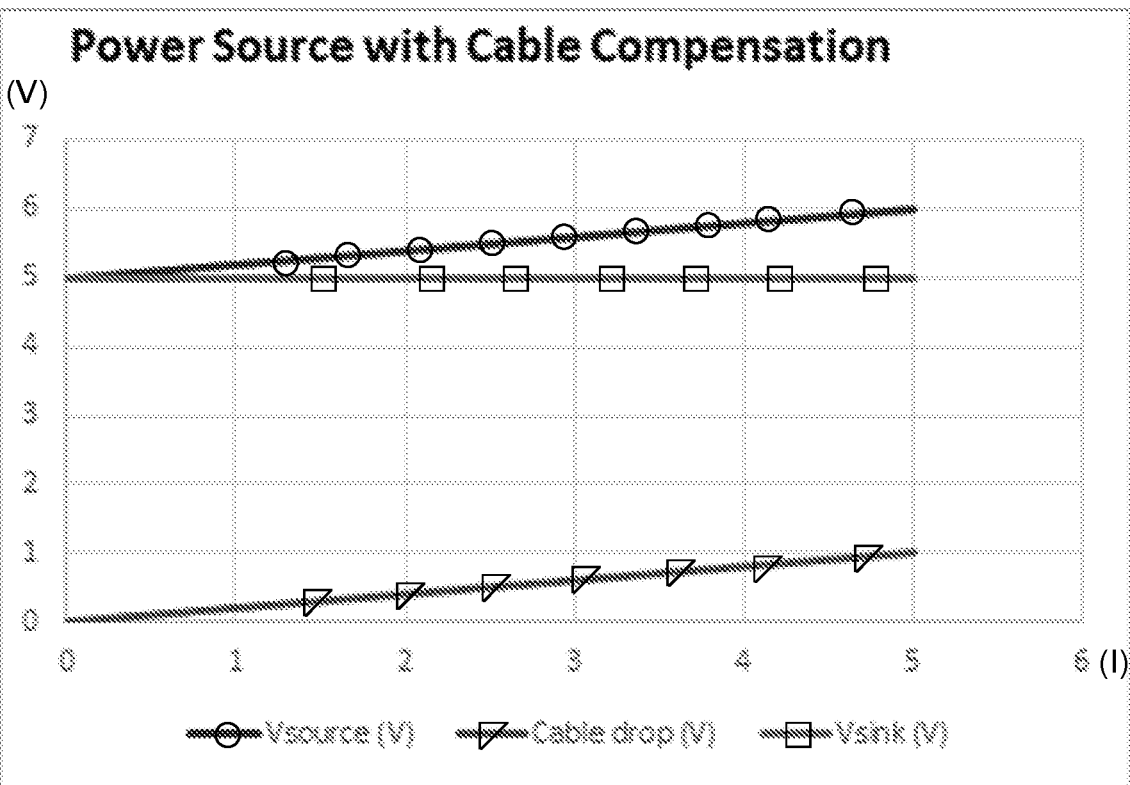
FIG. 2B is a graph illustrating power supplied between a source and sink with cable compensation according to an embodiment.

FIG. 2B is a graph illustrating power supplied between the source 102 and sink 112 with cable compensation according to an embodiment. As the voltage drop in the cable 101 increases, the source voltage is increased by a corresponding amount. This voltage compensation enables the sink voltage to remain at five volts, and thus not lose power supply voltage available to the electronic circuitry of the sink.

Conventionally, full hardware solutions for cable voltage compensation demand a reasonably complex set of hardware, adding cost and size to the source 102, which is a disadvantage in the source design. To reduce complexity and cost, the disclosed source may employ an integrated circuit (IC) solution in which firmware (or other code) executed on an IC performs cable voltage compensation that dynamically tracks changes in voltage drop of the cable 101. In order to do so, an IC controller may interact with coupled hardware to generate and react to certain interrupts in order to process firmware algorithms that enable dynamic tracking of the cable current ($I_{CABLE}$). The IC controller may then employ a recent cable current value to calculate, using a known resistance of the cable 101, the voltage drop. Knowing the voltage drop, the IC controller may supply an additional voltage, equal to the voltage drop, to the voltage bus ($V_{BUS}$). In this way, the IC controller may dynamically compensate for voltage drop in an environment of changing cable current. These and additional advantages will be apparent to one of ordinary skill in the art in view of the following description.

Figure 3:
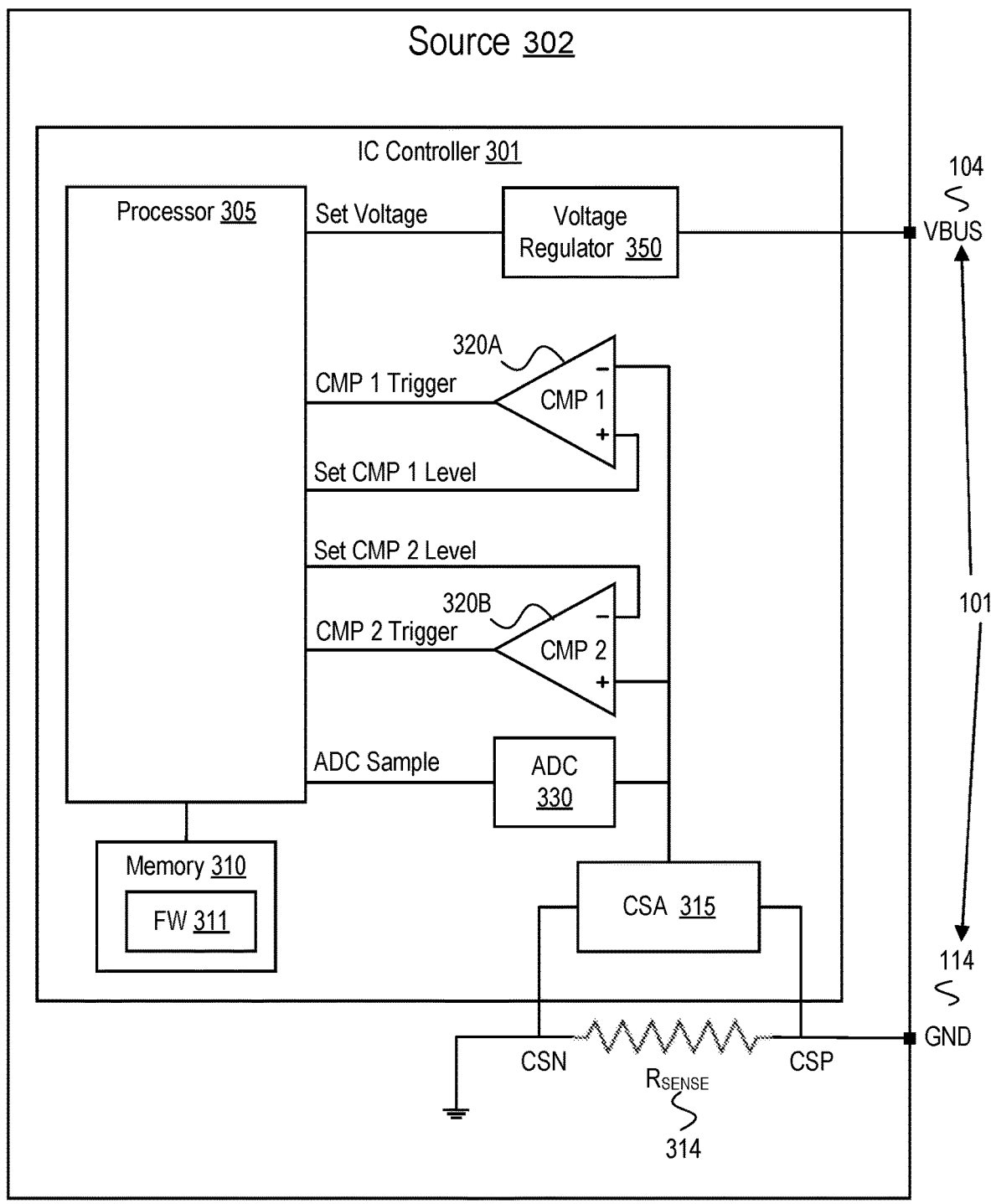
FIG. 3 is a block diagram of a power source according to an embodiment.

FIG. 3 is a block diagram of a power source 302 according to an embodiment. The source 302 may be similar to the power source 102 discussed with reference to FIG. 1. In various embodiments, the power source 302 includes an integrated circuit (IC) controller 301, which includes a processor 305 and memory 310, a first comparator 320A, a second comparator 320B, a current sense amplifier (CSA) 315, and an analog-to-digital converter (ADC) 330. The CSA 315 is illustrated coupled to either side of (e.g., across) a sense resistor ($R_{SENSE}$) 314 on the ground bus 114. In another embodiment, although not illustrated, the CSA 315 may be coupled to either side of (e.g., across) a sense resistor on the voltage bus 104.

The processor 305 may execute firmware 311 (or other instructions or code) stored in the memory 310 in order to perform the operations discussed herein. For example, the processor 305 may interact with the hardware components of the IC controller 301 to dynamically determine the voltage drop across the cable 101 during continuous operation of the power source 302. The processor 305 may then cause an additional voltage, equal to the voltage drop, to be supplied to the voltage bus 104, e.g., by directing the voltage regulator 350 to increase the supplied voltage above the nominal source voltage to the voltage bus 104. In embodiments, processor 305 may execute the firmware 311 in relation to the hardware components of FIG. 3 in interrupt mode to minimize latency in response to interrupts triggered by changes in cable current, and thus efficiently performing voltage drop compensation.

More specifically, in various embodiments, each of the first comparator 320A, the second comparator 320B, and the ADC 330 is coupled between the processor 305 and the CSA 315. In this way, a monitored current sensed by the CSA 315 is sent to the first comparator 320A, the second comparator 320B, and the ADC 330 according to the illustrated embodiment.

In this embodiment, the first comparator 320A is triggered when detecting that the monitored current from the CSA 315 is greater than or equal to a first reference value. The first comparator 320A thus detects an upward (or increased) change in the cable current. The processor 305 may set the first reference value in the first comparator 320A, which, as will be discussed in detail, may be determined based on a measured cable current plus a hysteresis value. Triggering the first comparator 320A may further trigger a first comparator interrupt within the processor 305.

Also, in this embodiment, the second comparator 320B is triggered when detecting that the monitored current from the CSA 315 is less than or equal to a second reference value. The second comparator 320B thus detects a downward (or decreased) change in the cable current. The processor 305 may set the second reference value in the second comparator 320B, which, as will be discussed in detail, may be determined based on a measured cable current minus a hysteresis value. Triggering the second comparator 320B may further trigger a second comparator interrupt within the processor 305.

In alternative or additional embodiments, the IC controller 301 may remain idle, e.g., in a low power consuming mode, until some change in the cable current is detected, e.g., by either the first comparator 320A or the second comparator 320B. In response to either of the first comparator interrupt or the second comparator interrupt, the processor 305 may use the ADC 330 to measure an absolute current flowing in the cable 101 and sensed by the CSA 315. In this way, a certain level of change in the cable current may first trigger one of the first comparator interrupt or the second comparator interrupt before an absolute current measurement is performed by using the ADC 330. Having the absolute current value of the cable current may enable a more precise measurement of the cable current with which to calculate the voltage drop, which was discussed with reference to FIG. 1. Further, by waiting for an interrupt, the ADC 330, which is more process and resource intensive, may be efficiently kept idle.

While two comparators and a ADC 330 are disclosed, alternative embodiments may be employed that utilize less than all three of these hardware components. For example, in a second embodiment, only the first comparator 320A and the second comparator 320B are used. The comparators may detect upward and downward change in the cable current, as discussed, and then use a quadrant search method by whichever of the two comparators is triggered to get the absolute cable current in response to detecting a change in the cable current.

For example, if the first comparator 320A is triggered, the processor 305 may, in response to the first comparator interrupt, variably change the first reference value within an upward quadrant of current values until triggering the first comparator 320A to determine the absolute current value for the cable current. By way of a second example, if the second comparator 320B is triggered, the processor 305 may, in response to the second comparator interrupt, variably change the second reference value within a downward quadrant of current values until triggering the second comparator 320B to determine the absolute current value for the cable current.

In further embodiment, one of the first comparator 320A or the second comparator 320B is employed along with the ADC 330. In this embodiment, the single comparator may be set to detect either an upward or downward change in the cable current. The processor 305 may estimate, for example, an expected direction of change based on a level of the most recently measured absolute current value using the ADC 330. When an interrupt is detected for the comparator, the processor 305 may again measure the absolute current value of the cable current on which to base determination of the voltage drop.

In another embodiment, only the ADC 330 is present and the first and second comparators 320A and 320B are not used. In this embodiment, the processor 305 may employ a polling mechanism using the ADC 330 in order to periodically detect the absolute current value of the cable current. This embodiment, may however, block or slow down normal operation of the processor 305 because ADC measurement and compensation algorithm is run continuously in a firmware control loop. Also, as this embodiment is based on polling the ADC cable current in order to monitor the cable current, this embodiment could lead to slower response to changes in the cable current for purposes of supplying compensated voltage for a corresponding cable drop.

Figure 4A:
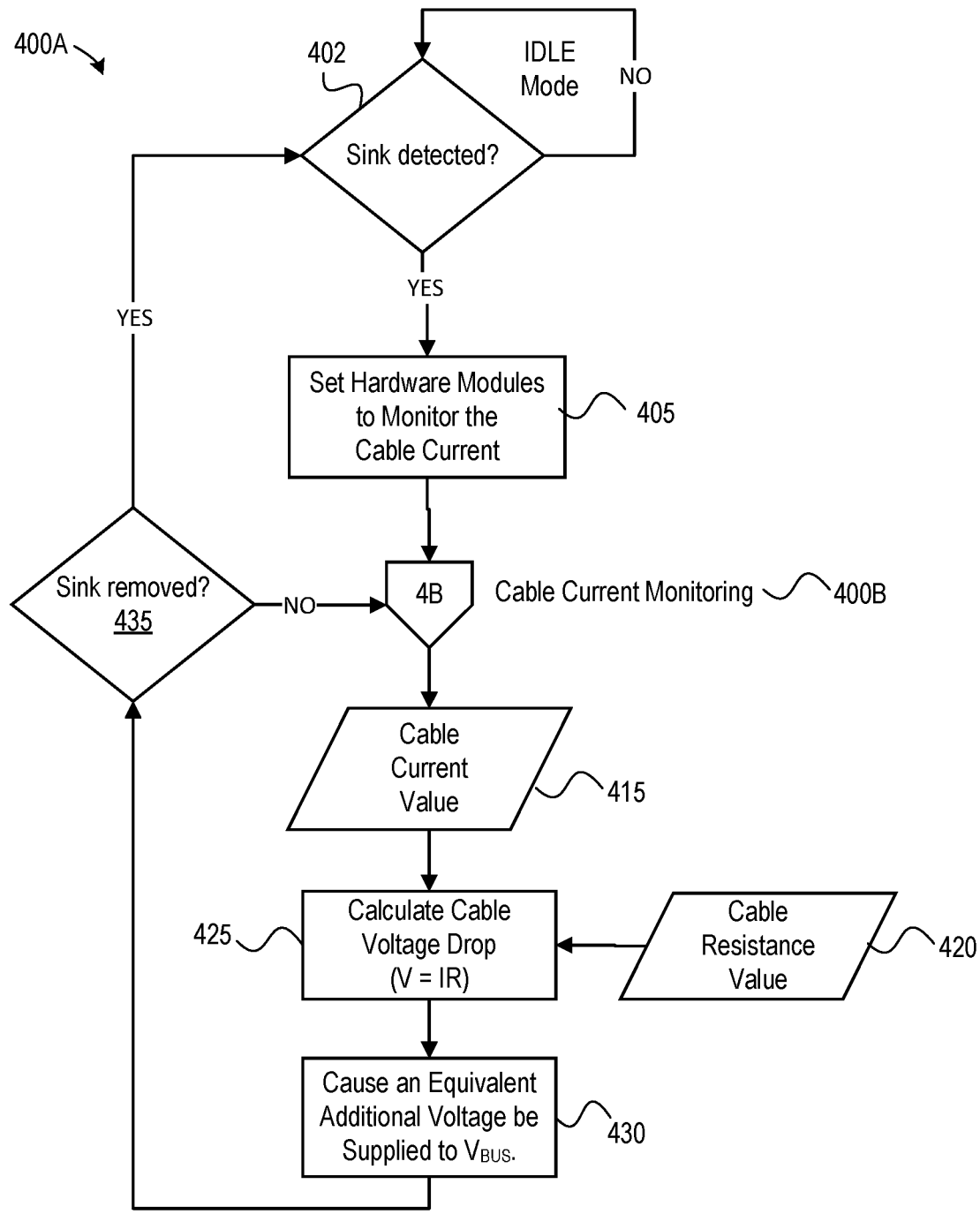
FIG. 4A is a flow diagram for a method of adjusting the source voltage according to a voltage drop due to a cable resistance and load current flowing through the cable according to an embodiment.

FIG. 4A is a flow diagram for a method 400A of adjusting source voltage according to a voltage drop due to a cable resistance and load current flowing through the cable according to an embodiment. The method 400A can be performed by processing logic that can include hardware (e.g., processing device, circuitry, dedicated logic, programmable logic, microcode or firmware, hardware of a device, integrated circuit, etc.), software (e.g., instructions run or executed on a processing device), or a combination thereof. In one embodiment, the method 400A is performed by IC controller 301, e.g., via the processor 305 executing firmware 311 or other code or instructions stored in the memory 310. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing logic determines whether the sink 112 (e.g., a sink device) is detected that is connected to the cable 101. If no sink is detected, no current is being drawn by any sink device, and thus the algorithm may remain in IDLE mode, and thus, the IC controller 301 may remain in a power saving (or sleep) state. In one embodiment, the sleep state may be associated with a sub-part of the IC controller 301 and the hardware components illustrated in FIG. 3. In response to detecting the sink 112 connected to the distal end of the cable 101, the processing logic advances into voltage drop compensation functionality.

At operation 405, the processing logic configures a set of hardware modules to monitor the cable current of the cable 101. This may include initializing one or more of the hardware components discussed with reference to FIG. 3 to be used in connection with commands and interrupts to and from the processor 305. In some cases, this setting of the hardware may include forming connections between the IC controller 301 and the cable 101, e.g., with one of the voltage bus 104 or the ground bus 114.

At operation 400B, the processing logic may continuously perform cable current monitoring in order to track changes in a cable current value of the cable 101. This cable current monitoring will be discussed in more detail with reference to FIG. 4B and additional reference to FIG. 3.

Figure 4B:
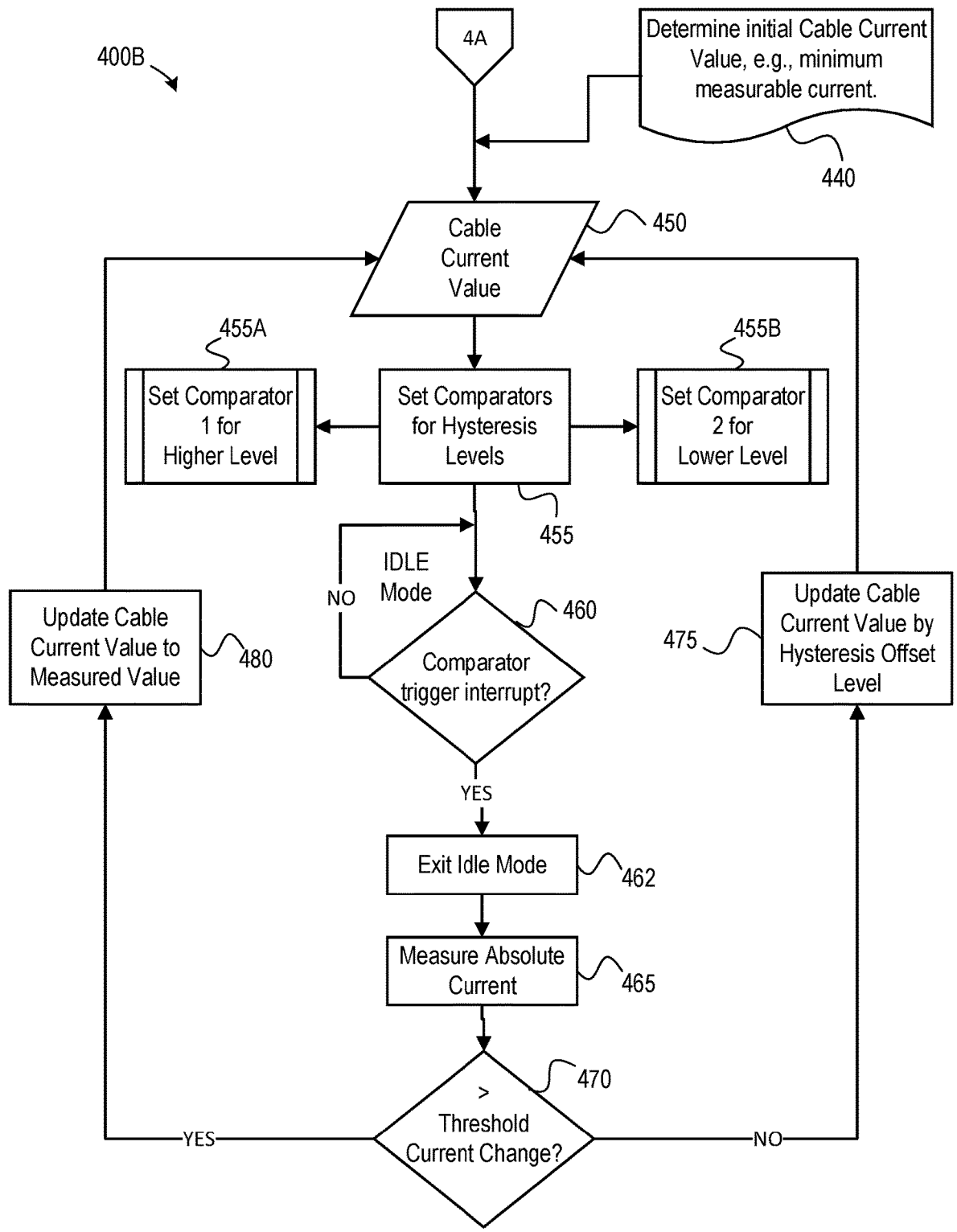
FIG. 4B is a flow diagram for a method of monitoring and measuring the cable current using an integrated circuit (IC) controller according to an embodiment.

At operation 425, the processing logic calculates the voltage drop ($V_{DROP}$) of the cable 101 based on the resistance of the cable and the cable current value. At operation 420, the processing logic may receive or retrieve the resistance of the cable from the memory 310, e.g., which may be a known resistance pre-programmed into the IC controller 301. The cable current value may be a most recent value as determining by the cable current monitoring (FIG. 4B). The voltage drop may be calculated according to Ohm's Law, e.g., the cable current times the cable resistance.

At operation 430, the processing logic causes an additional voltage, equal to the voltage drop, to be supplied to the voltage bus 104 ($V_{BUS}$). In one embodiment, the processor 305 adjusts a voltage supplied by the voltage regulator 350 to the voltage bus 104. The total supplied voltage may thus be a nominal voltage supply value (such as 5 V, 7 V, 10 V, or the like) in addition to the compensated voltage equal to the voltage drop. Because the voltage drop may change from time to time based on the current drawn by the sink 112, the total supplied voltage may be adjusted up or down depending on recent changes to the voltage drop. Thus, the voltage added to the nominal supply voltage may be an updated additional voltage that is equal to a newly determined voltage drop.

At operation 435, the processing logic determines whether the sink has been removed. If the sink has been removed, the processing logic loops back to operation 402 to wait to detect connection (or reconnection) of the sink. If, at operation 435, the sink has not been removed, the processing logic returns to FIG. 4B to continue monitoring and measuring the load current.

FIG. 4B is a flow diagram for a method 400B of dynamically monitoring and measuring the cable current using an integrated circuit (IC) controller according to an embodiment. The method 400B can be performed by processing logic that can include hardware (e.g., processing device, circuitry, dedicated logic, programmable logic, microcode or firmware, hardware of a device, integrated circuit, etc.), software (e.g., instructions run or executed on a processing device), or a combination thereof. In one embodiment, the method 400B is performed by IC controller 301, e.g., via the processor 305 executing firmware 311 or other code or instructions stored in the memory 310. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 440, the processing logic determines an initial cable current value as a minimum measurable current. For example, the processing logic can measure, using the CSA 315, an initial current value of the voltage bus of the cable 101 based on a monitored cable current. In one embodiment, the processing logic receives a sample from the ADC 330 in order to determine an absolute current value to determine the initial current value of the cable 101.

At operation 450, the processing logic updates the cable current value with the initial cable current value determined at operation 440. At operation 455, the processing logic sets current reference values of the first and second comparators 320A and 320B based on hysteresis levels. The hysteresis levels may enable some margin in the cable current before triggering interrupts in the IC controller 301, to thus avoid repeatedly triggering interrupts and wasting processing power in response to current changes due to noise or other supply power hysteresis.

For example, at operation 455A, the processing logic sets the first reference value of the first comparator 320A to a higher level. To set the first reference value of the first comparator 320A, the processing logic may add a hysteresis offset value to the cable current value to generate a high reference value and change the first reference value of the first comparator 320A to the high reference value.

At operation 455B, the processing logic sets the second reference value of the second comparator 320B to a lower level. To set the second reference value of the second comparator 320B, the processing logic may subtract the hysteresis offset value from the cable current value to generate a low reference value and change the second reference value of the second comparator 320B to the low reference value.

At operation 460, the processing logic determines whether one of the first comparator 320A or the second comparator 320B triggers an interrupt. For example, the first comparator 320A triggers a first comparator interrupt in response to detecting that a monitored current value from the CSA 315 is greater than or equal to a first reference value. Or, the second comparator 320B triggers a second comparator interrupt in response to detecting that the monitored current value from the CSA 315 is less than the second reference value.

As long as no interrupt is triggered, e.g., the change in the cable current value is within the hysteresis offset value in either direction, the processing logic, at operation 460, continues to monitor for a significant enough current change to trigger one of the comparators. Also, at operation 460 and while monitoring, the algorithm being executed by the processor 305 to perform voltage drop compensation may enter (or reentering) IDLE mode. Because the execution of the firmware 311 is based on an interrupt mode, at operation 462, an interrupt triggered by one of the comparators at operation 460 may pull the IC controller 301 (and thus the processor 305) out of the IDLE mode and any corresponding sleep state. In this way, processing resources are conserved when no substantial change to the cable current is detected.

In response to exiting the IDLE mode, e.g., due to one of the first comparator interrupt or the second comparator interrupt being triggered at operation 460, the processing logic may further, at operation 465, measure an absolute current value of the cable current using the ADC 330. This absolute current value may be a more precise value for the cable current useable to detect how large is the change in the cable current.

At operation 470, the processing logic determines whether a difference between the absolute current value and the initial current value (or cable current value if within a further loop of the method 400B) exceeds a threshold current change. This threshold current change may be a larger current change responsive to some large change in current drawn by the sink 112.

If, at operation 470, the difference does not exceed the threshold current change, the processing logic, at operation 475, updates the cable current value by the hysteresis offset value. For example, if in response to the first comparator interrupt, the processing logic may add the hysteresis offset value to the cable current value, which, at operation 450, becomes the new cable current value. Or, if in response to the second comparator interrupt, the processing logic may subtract the hysteresis offset value from the cable current value, which, at operation 450, becomes the new cable current value.

If, at operation 470, the difference does exceed the threshold current change, the processing logic updates the cable current value to the measured value, e.g., the absolute current value measured by the ADC 330. Thus, at operation 450, the processing logic replaces the cable current value with the absolute current value sampled by the ADC 330. In embodiments, ADC-measured absolute cable current helps in immediate response to large cable current change, which otherwise would take multiple steps to get to absolute current by updating comparators using hysteresis steps.

In response to looping back through operation 450, the processing logic may proceed to operation 455 to again set the first and second reference values of the first and second comparators 320A and 320B, respectively, using the hysteresis offset value. In other words, the processing logic adds the hysteresis offset value to the new cable current value to set the first reference value at the first comparator 320A. Further, the processing logic subtracts the hysteresis offset value from the new cable current value to set the second reference value at the second comparator 320B.

The following include a few examples to illustrate functioning of the methods 400A and 400B as above described. Assume, for example, that initial values are as set out in Table 1. Note that these are merely examples for purposes of explanation and values are expected to vary in many ways outside of these examples with the scope of the present disclosure.

TABLE 1

| Parameter | Value |
| --- | --- |
| Initial Cable Current | 1A |
| Hysteresis Offset Value | 0.1A |
| Threshold Current Change | 0.5A |

Based on these initial values, the processing logic, at operation 455, may set the first comparator 320A to 1.1 A (which is 1 A+0.1 A) and the second comparator 320B to 0.9 A (which is 1 A−0.1 A).

Scenario 1: Assume that the cable current changes to 1.05 A. Because the change in the cable current value is within the hysteresis levels, neither of the comparators are triggered, and the IC controller 301 stays in IDLE mode at operation 460.

Scenario 2: Assume that the cable current changes to 1.15 A. Because the cable current value is more than 1.1 A, the cable current triggers the first comparator 320A at operation 460. Thus, the processing logic continues to, at operation 465, measure the absolute current using ADC. Assume the absolute current change is 0.15 A (e.g., 1.15 A−1 A), which is not more than 0.5 A, the threshold current change. Thus, the processing logic, at operation 475, update the cable current value by the hysteresis offset value, that is 1.1 A (or 1 A+0.1 A).

At operation 425 of FIG. 4A, the processing logic calculates the voltage drop based on the new cable current value and, at operation 430, supplies an updated voltage drop onto to supply voltage of the voltage bus 104. Because the methods 400A and 400B are continuously executed except when in IDLE mode, the processing logic continues to, at operation 455A, set the first reference value of the first comparator 320A to 1.2 A and, at operation 455B, set the second reference value of the second comparator to 1 A. The processor 305 may then remain in IDLE mode at operation 460 until the new trigger is received.

Scenario 3: Assume that the cable current changes to 2 A. Because the cable current is more than 1.1 A, the cable current triggers the first comparator 320A at operation 460. The processing logic may cause the processing logic to exit IDLE Mode at operation 462 and, at operation 465, measure the absolute current using the ADC 330. Assume that the absolute current change is 1 A (2 A−1 A), which is more than 0.5 A, the threshold current change.

The processing logic, at operation 475, updates the cable current value by absolute value, which is 2 A. At operation 425 of FIG. 4A, the processing logic calculates the voltage drop based on the new cable current value and, at operation 430, supplies an updated voltage drop onto to supply voltage of the voltage bus 104. Because the methods 400A and 400B are continuously executed except when in IDLE mode, the processing logic continues to, at operation 455A, set the first reference value of the first comparator 320A to 2.1 A and, at operation 455B, set the second reference value of the second comparator to 1.9 A. The processor 305 may then remain in IDLE mode at operation 460 until the new trigger is received.

In addition to the initial values of Table 1, assume that the expected supply voltage is 5V and the cable resistance is 0.5 Ohm. Thus, the additional voltage added for compensation begins at 0.5V (1 A*0.5 Ohm), yielding a total supply voltage of 5.5V. Further, at operation 455A, the processing logic sets the first comparator 320A to 1.1 A and, at operation 455B, the processing logic sets the second comparator 320B to 0.9 A.

If, at operation 460, the first comparator triggers and a new measured cable current value is 1.1 A (at operation 465), the calculated supply voltage (at operations 425 and 430) would be 5.55V, e.g., 5V plus 1.1 A*0.5 Ohm by going through operation 475. Thus, in this example, the total supply voltage on the voltage bus has increased due to the first comparator interrupt triggering.

If, however, at operation 460, the second comparator triggers and a new measured cable current value is 0.9 A, then the calculated supply voltage (at operations 425 and 430) would be 5.45 V, e.g., 5V plus 0.9 A*0.5 Ohm by also going through operation 475. Thus, in this example, the total supply voltage on the voltage bus has decreased due to the second comparator interrupt triggering.

FIG. 5A, 5B, 5C, 5D are flow diagrams for a method of using the IC controller 301 to compensate source voltage according to a voltage drop across the connection cable due to the cable resistance and the current flowing through the cable according to another embodiment. The method (or set of sub-methods) can be performed by processing logic that can include hardware (e.g., processing device, circuitry, dedicated logic, programmable logic, microcode or firmware, hardware of a device, integrated circuit, etc.), software (e.g., instructions run or executed on a processing device), or a combination thereof. In one embodiment, the method is performed by IC controller 301, e.g., via the processor 305 executing firmware 311 or other code or instructions stored in the memory 310. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 5A:
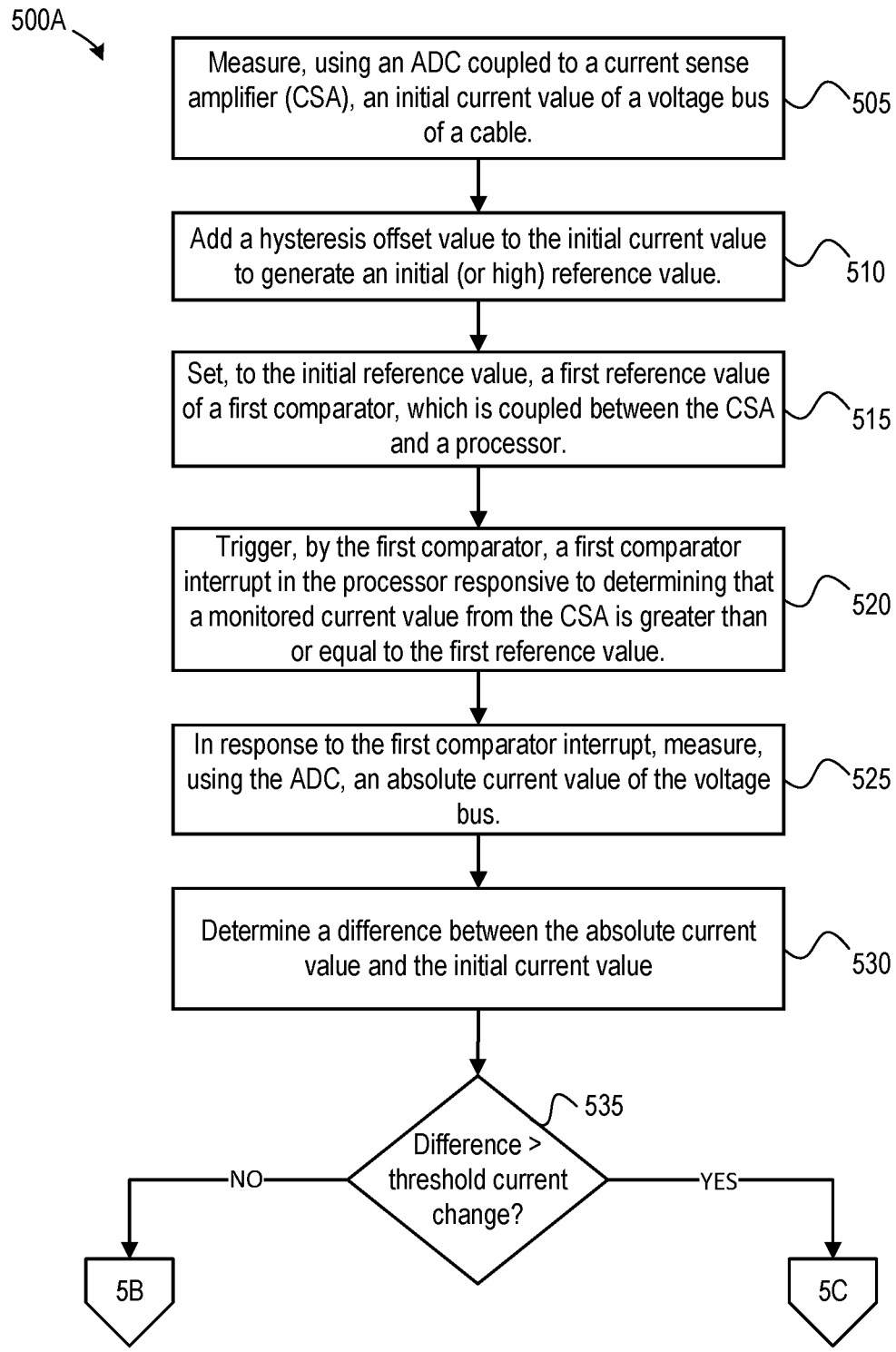
FIGS. 5A, 5B, 5C, 5D are flow diagrams for a method of using the IC controller to compensate source voltage according to a voltage drop across the connection cable due to the cable resistance and current flowing through the cable according to another embodiment.

FIG. 5A is a flow diagram for a method 500A of determining whether a difference detected as a change in cable current exceeds a threshold current change. For example, at operation 505, the processing logic measures, using an analog-to-digital converter (ADC) coupled to a current sense amplifier (CSA), an initial current value of a voltage bus of a cable, where the CSA monitors a current on the voltage bus.

At operation 510, the processing logic adds a hysteresis offset value to the initial current value to generate an initial reference value, which is a high reference value. In a further embodiment, at operation 510, the processing logic further subtracts the hysteresis offset value from the initial current value to generate a low reference value.

At operation 515, the processing logic sets, to the initial reference value, a first reference value of a first comparator that is coupled between the CSA and the IC controller. In the further embodiment, at operation 515, the processing logic also sets, to the low reference value of a second comparator that is coupled between the CSA and the IC controller.

At operation 520, the processing logic triggers, by the first comparator, a first comparator interrupt in the IC controller responsive to determining that a monitored current value from the CSA is greater than or equal to the first reference value. In the further embodiment, at operation 520, the processing logic may instead trigger a second comparator interrupt in the second controller responsive to determining that the monitored current value from the CSA is less than the second reference value.

At operation 525, in response to the first comparator interrupt (or the second comparator interrupt), the processing logic measures, using the ADC, an absolute current value of the voltage bus. At operation 530, the processing logic determines a difference between the absolute current value and the initial current value.

At operation 535, the processing logic determines whether the difference is greater than (or exceeds) the a threshold current change. If the difference does not exceed the threshold current change, the method 500A transitions to FIG. 5B. If the difference does exceed the threshold current change, the method 500 transitions to FIG. 5C.

Figure 5B:
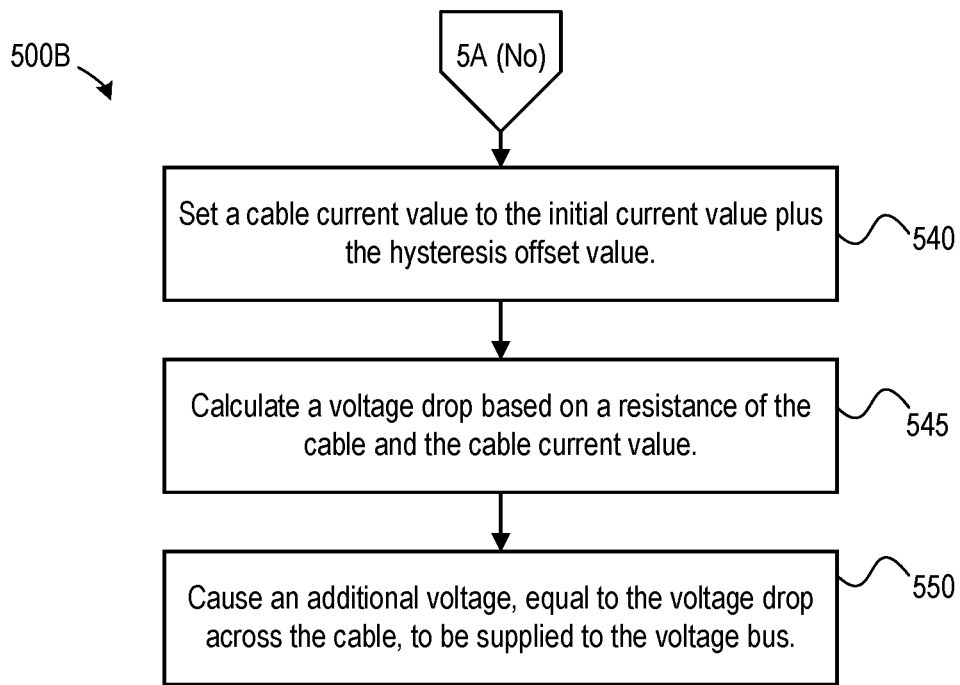

FIG. 5B is a flow diagram of a method 500B for updating the cable current value according to a hysteresis offset value, e.g., in response to determining that the difference between the absolute current value and the initial current value is less than or equal to the threshold current change, which was determined at operation 535. At operation 540, the processing logic sets the cable current value to the initial current value plus the hysteresis offset value. In the further embodiment (where the second comparator interrupt was instead triggered), at operation 540, the processing logic sets the cable current value to the initial current value minus the hysteresis offset value.

At operation 545, the processing logic calculates a voltage drop based on a resistance of the cable and the cable current value. At operation 550, the processing logic causes an additional voltage, equal to the voltage drop across the cable, to be supplied to the voltage bus.

Figure 5C:
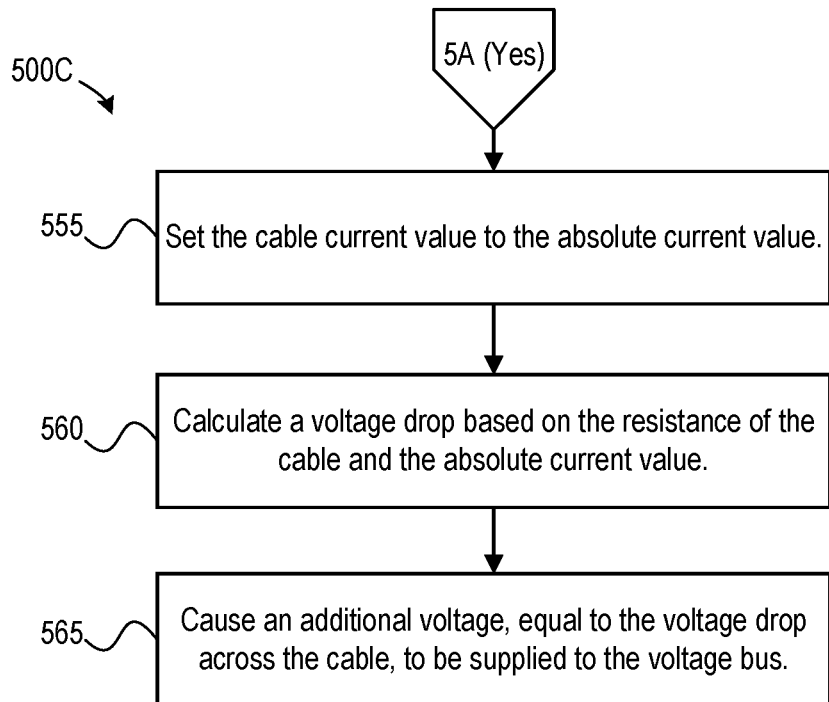

FIG. 5C is a flow diagram of a method 500C for updating the cable current value according to the absolute current value. For example, at operation 555, the processing logic sets the cable current value to the absolute current value as measured by the ADC 330. At operation 560, the processing logic calculates a voltage drop based on the resistance of the cable and the absolute current value, e.g., which is now also the updated cable current value. At operation 565, the processing logic causes a second additional voltage, equal to the second voltage drop across the cable, to be supplied to the voltage bus.

Figure 5D:
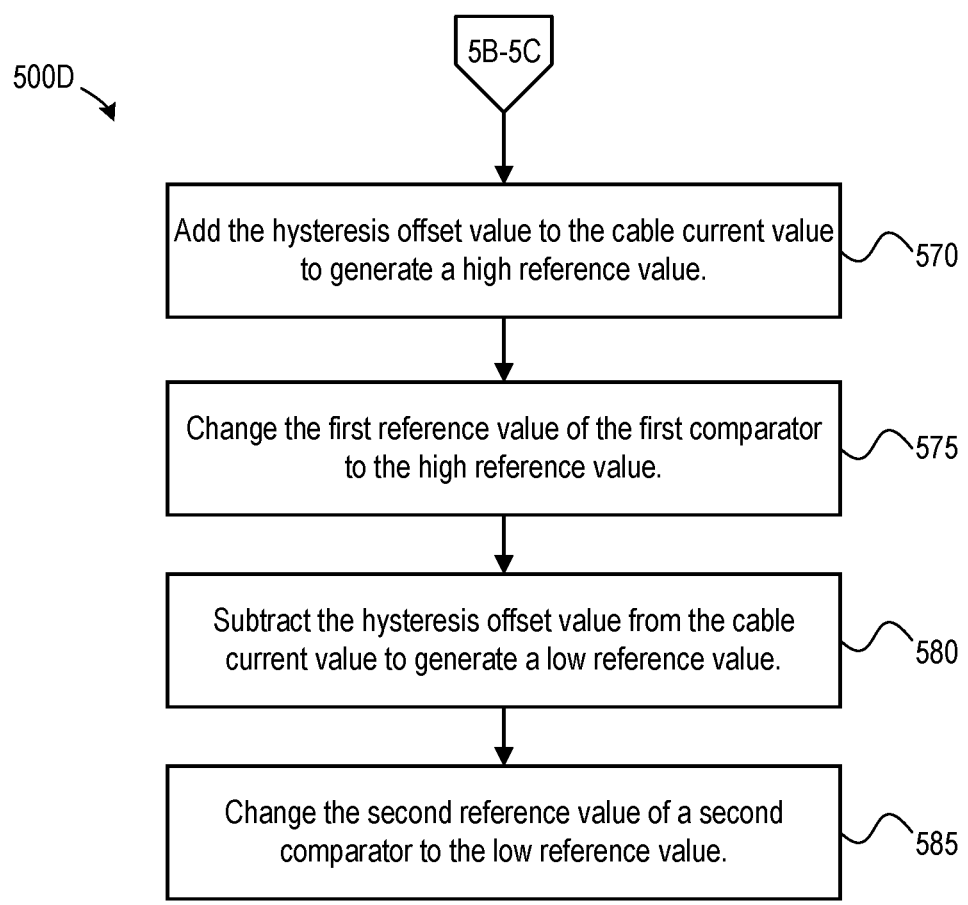

FIG. 5D is a flow diagram of a method 500D for updating high and low reference values of the first and second comparators 320A and 320B after an update to the cable current value. At operation 570, the processing logic adds the hysteresis offset value to the cable current value to generate a high reference value. At operation 575, the processing logic changes the first reference value of the first comparator to the high reference value.

With continued reference to FIG. 5D, at operation 580, the processing logic subtracts the hysteresis offset value from the cable current value to generate a low reference value. At operation 585, the processing logic changes the second reference value of the second comparator to the low reference value.

With continued reference to FIG. 3, the processor 305 may represent one or more processing devices such as a microprocessor device, central processing unit, or the like processing device, which may be programmed specifically by way of the firmware 311 (or other code or instructions) to perform the operations discussed herein. More particularly, the processor 305 may be complex instruction set computing (CISC) microprocessor, reduced instruction set computer (RISC) microprocessor, very long instruction word (VLIW) microprocessor, or processing device implementing other instruction sets, or processing devices implementing a combination of instruction sets. The processor 305 may also be one or more special-purpose processing devices such as an application specific integrated circuit (ASIC), a field programmable gate array (FPGA), a digital signal processing device (DSP), network processing device, or the like. In one implementation, the processor 305 may include one or more processing cores, e.g., and is thus a multi-core processor.

In another implementation, the processor 305 may include a chipset (not illustrated), which refers to a group of integrated circuits, or chips, that are designed to work with the IC controller 301 and controls communications between the IC controller 301 and external devices. For example, the chipset may be a set of chips on a motherboard that links the IC controller 301 to very high-speed devices, such as main memory 404 and graphic controllers, as well as linking the IC controller 301 to lower-speed peripheral buses of peripherals, such as USB, PCI, or ISA buses.

The memory 310 may include volatile memory (e.g., read-only memory (ROM), flash memory, dynamic random access memory (DRAM) (such as synchronous DRAM (SDRAM) or DRAM (RDRAM), etc.), a static memory (e.g., flash memory, static random access memory (SRAM), etc.), which communicate with each other via a data bus. The memory 310 may represent or include a computer-readable storage medium on which is stored instructions embodying any one or more of the methodologies of functions described herein.

The computer-readable storage medium of the memory 310 may also be used to store instructions utilizing the processor 305, such as described with respect to FIGS. 3-5D, and/or a software library containing methods that call the above applications. The term "computer-readable storage medium" shall also be taken to include any medium that is capable of storing, encoding or carrying a set of instruction for execution by the machine and that cause the machine to perform any one or more of the methodologies of the implementations. The term "computer-readable storage medium" shall accordingly be taken to include, but not be limited to, solid-state memories, and optical and magnetic media.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one implementation, refers to the hardware, which is specifically configured to recognize and/or execute the code to be held on a non-transitory medium. Furthermore, in another implementation, use of a module refers to the non-transitory medium including the code, which is specifically adapted to be executed by the microcontroller to perform predetermined operations. And as may be inferred, in yet another implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one implementation, use of the term logic includes hardware, such as transistors, registers, or other hardware, such as programmable logic devices.

Use of the phrase 'configured to,' in one implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one implementation, refers to some apparatus, logic, hardware, and/or element designed in such a way to enable use of the apparatus, logic, hardware, and/or element in a specified manner. Note as above that use of to, capable to, or operable to, in one implementation, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one implementation, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "adjusting," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus for performing the operations herein. This apparatus may be specially constructed for the required purposes, or it may comprise a general-purpose hardware selectively activated or reconfigured by a firmware stored therein. Such firmware may be stored in a non-transitory computer-readable storage medium, such as, but not limited to, NVMs, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding or carrying a set of instructions for execution by the hardware and that causes the hardware to perform any one or more of the methodologies of the present embodiments. The term "computer-readable storage medium" shall accordingly be taken to include, but not be limited to, solid-state memories, optical media, electro-magnetic media, any medium that is capable of storing a set of instructions for execution by hardware and that causes the hardware to perform any one or more of the methodologies of the present embodiments.

The above description sets forth numerous specific details such as examples of specific systems, components, methods and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular embodiments may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

In the above description, for purposes of explanation, numerous specific details are set forth in order to provide a thorough understanding of the present disclosure. It will be evident, however, to one skilled in the art that the present disclosure may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the disclosure. The phrase "in one embodiment" located in various places in this description does not necessarily refer to the same embodiment.

What is claimed is:

1. An integrated circuit comprising:
   a processor coupled to a voltage bus of a cable and located within a universal serial bus (USB) compatible power supply device;
   a current sense amplifier (CSA) coupled to a sense resistor on one of the voltage bus or a ground bus of the cable, the CSA to monitor a current of the voltage bus;
   a first comparator coupled to the CSA and the processor, the first comparator to trigger in response to detecting that a monitored current value from the CSA is greater than or equal to a first reference value, which includes a hysteresis offset value; and
   an analog-to-digital converter (ADC) coupled to the CSA and the processor;
   wherein, in response to detecting the trigger of the first comparator, the processor is to:
      trigger the ADC to measure an absolute current value of the voltage bus; and
      cause an additional voltage, equal to a voltage drop across the cable based on the absolute current value, to be supplied to the voltage bus.

2. The integrated circuit of claim 1, wherein the processor is further to:
   set the first reference value of the first comparator to an initial current value of the voltage bus plus the hysteresis offset value;
   determine that a difference between the absolute current value and the initial current value of the voltage bus exceeds a threshold current change; and
   calculate the voltage drop based on a resistance of the cable and the absolute current value.

3. The integrated circuit of claim 2, wherein the trigger of the first comparator causes a first comparator interrupt in the processor, further comprising:

a second comparator coupled to the CSA and the processor;

wherein the processor is further to set a second reference value of the second comparator to the initial current value minus the hysteresis offset value; and wherein the second comparator is to trigger a second comparator interrupt in the processor in response to detecting that the monitored current value is less than the second reference value.

4. The integrated circuit of claim 1, wherein the processor is further to replace a cable current value, for the cable, with the absolute current value.

5. The integrated circuit of claim 4, wherein the trigger of the first comparator causes a first comparator interrupt in the processor, further comprising:

a second comparator coupled to the CSA and the processor, the second comparator to trigger a second comparator interrupt in the processor in response to detecting that the monitored current value from the CSA is less than a second reference value, and wherein the processor is further to:

add a hysteresis offset value to the cable current value to generate a high reference value;

change the first reference value of the first comparator to the high reference value;

subtract the hysteresis offset value from the cable current value to generate a low reference value; and change the second reference value of the second comparator to the low reference value.

6. The integrated circuit of claim 5, wherein, in response detecting the second comparator interrupt, the processor is further to:

trigger the ADC to measure a second absolute current value of the voltage bus;

determine that the difference between the second absolute current value and the cable current value is less than or equal to the threshold current change;

decrease the cable current value by the hysteresis offset value;

calculate a second voltage drop based on the resistance of the cable and the cable current value; and cause an updated additional voltage, equal to the second voltage drop, to be supplied to the voltage bus.

7. A method comprising:

measuring, by a processor, using an analog-to-digital converter (ADC) coupled to a current sense amplifier (CSA), an initial current value of a voltage bus of a cable, wherein the CSA monitors a current on the voltage bus and is located within a universal serial bus (USB) compatible power supply device;

setting, by the processor, a first reference value of a first comparator that is coupled between the CSA and the processor, wherein the setting comprises adding a hysteresis offset value to the initial current value to generate the first reference value;

triggering, by the first comparator, the processor responsive to determining that a monitored current value from the CSA is greater than or equal to the first reference value; and in response to the triggering, the processor:

measuring, using the ADC, an absolute current value of the voltage bus; and causing an additional voltage, equal to a voltage drop across the cable based on the absolute current value, to be supplied to the voltage bus.

8. The method of claim 7, further comprising:

determining a difference between the absolute current value and the initial current value; and in response to determining that the difference is less than or equal to a threshold current change:

setting a cable current value to the initial current value plus the hysteresis offset value; and calculating the voltage drop based on a resistance of the cable and the cable current value.

9. The method of claim 8, further comprising setting, by the processor, a second reference value of a second comparator that is coupled between the CSA and the processor, wherein the setting comprises subtracting the hysteresis offset value from the initial current value to generate the second reference value.

10. The method of claim 9, further comprising, in response to determining that the difference does not exceed a threshold current change:

adding the hysteresis offset value to the cable current value to generate a high reference value;

changing the first reference value of the first comparator to the high reference value;

subtracting the hysteresis offset value from the cable current value to generate a low reference value; and changing the second reference value of a second comparator to the low reference value.

11. The method of claim 8, wherein the additional voltage is a first additional voltage, the method further comprising, in response to determining that the difference exceeds the threshold current change:

calculating a second voltage drop based on the resistance of the cable and the absolute current value; and causing a second additional voltage, equal to the second voltage drop, to be supplied to the voltage bus.

12. The method of claim 8, further comprising, in response to determining that the difference exceeds the threshold current change:

setting the cable current value to the absolute current value;

adding the hysteresis offset value to the cable current value to generate a high reference value;

changing the first reference value of the first comparator to the high reference value;

subtracting the hysteresis offset value from the cable current value to generate a low reference value; and changing a second reference value of a second comparator to the low reference value, the second comparator also coupled between the CSA and the processor.

13. The method of claim 12, wherein the triggering causes a first comparator interrupt in the processor, the method further comprising:

detecting, by the processor, a second comparator interrupt triggered by the second comparator indicative of the monitored current value of the voltage bus being less than the second reference value; and in response to the second comparator interrupt, the processor:

triggering the ADC to measure a second absolute current value of the voltage bus;

determining that the difference between the second absolute current value and the cable current value is less than or equal to the threshold current change;

decreasing the cable current value by the hysteresis offset value;

calculating a second voltage drop based on the resistance of the cable and the cable current value; and causing an updated additional voltage, equal to the second voltage drop, to be supplied to the voltage bus.

14. A non-transitory computer-readable storage medium storing instructions, which when executed by a processor that is coupled to a voltage bus of a cable, cause the processor to perform a plurality of operations comprising:
measuring, using an analog-to-digital converter (ADC) coupled to a current sense amplifier (CSA), a first current value of the voltage bus, wherein the CSA monitors a current of the voltage bus and is located within a universal serial bus (USB) compatible power supply device;
setting a first reference value of a first comparator that is coupled between the CSA and the processor, wherein the setting comprises adding a hysteresis offset value to the first current value to generate the first reference value;
setting a second reference value of a second comparator that is coupled between the CSA and the processor, wherein the setting comprises subtracting the hysteresis offset value from the first current value to generate the second reference value;
entering an IDLE mode;
detecting a first comparator interrupt responsive to the first comparator triggering based on a monitored current value from the CSA being greater than or equal to the first reference value; and
detecting a second comparator interrupt responsive to the second comparator triggering based on the monitored current value from the CSA being less than or equal to the second reference value.

15. The non-transitory computer-readable storage medium of claim 14, in response to the first comparator interrupt, the plurality of operations further comprising:
exiting the IDLE mode;
measuring, using the ADC, an absolute current value of the voltage bus;
determining a difference between the absolute current value and the first current value; and
in response to determining that the difference exceeds a threshold current change:
calculating a voltage drop based on a resistance of the cable and the absolute current value; and
causing an additional voltage, equal to the voltage drop, to be supplied to the voltage bus.

16. The non-transitory computer-readable storage medium of claim 15, the plurality of operations further comprising:
setting a cable current value to the absolute current value;
adding the hysteresis offset value to the cable current value to generate a high reference value;
changing the first reference value of the first comparator to the high reference value;
subtracting the hysteresis offset value from the cable current value to generate a low reference value;
changing a second reference value of a second comparator to the low reference value; and
reentering the IDLE mode.

17. The non-transitory computer-readable storage medium of claim 14, in response to the second comparator interrupt, the plurality of operations further comprising:
exiting the IDLE mode;
measuring, using the ADC, an absolute current value of the voltage bus;
determining a difference between the absolute current value and the first current value; and
in response to determining that the difference is less than or equal to a threshold current change:
decreasing a cable current value by the hysteresis offset value;
calculating a voltage drop based on a resistance of the cable and the cable current value; and
causing an additional voltage, equal to the voltage drop, to be supplied to the voltage bus.

18. The non-transitory computer-readable storage medium of claim 17, the plurality of operations further comprising:
adding the hysteresis offset value to the cable current value to generate a high reference value;
changing the first reference value of the first comparator to the high reference value;
subtracting the hysteresis offset value from the cable current value to generate a low reference value;
changing the second reference value of the second comparator to the low reference value; and
reentering the IDLE mode.

19. The non-transitory computer-readable storage medium of claim 14, in response to the first comparator interrupt, the plurality of operations further comprising:
exiting the IDLE;
measuring, using the ADC, an absolute current value of the voltage bus;
determining a difference between the absolute current value and the first current value; and
in response to determining that the difference is less than a threshold current change:
increasing a cable current value by the hysteresis offset value;
calculating a voltage drop based on a resistance of the cable and the cable current value; and
causing an additional voltage, equal to the voltage drop, to be supplied to the voltage bus.

20. The non-transitory computer-readable storage medium of claim 19, in response to the first comparator interrupt, the plurality of operations further comprising:
adding the hysteresis offset value to the cable current value to generate a high reference value;
changing the first reference value of the first comparator to the high reference value;
subtracting the hysteresis offset value from the cable current value to generate a low reference value;
changing the second reference value of the second comparator to the low reference value; and
reentering the IDLE mode.

* * * * *